United States Patent [19]

Kobayashi et al.

[11] Patent Number: 4,807,015
[45] Date of Patent: Feb. 21, 1989

[54] SEMICONDUCTOR DEVICE HAVING ELECTRODES AND OR INTERCONNECTIONS OF REFRACTORY METAL FILM CONTAINING SILICON OXIDE

[75] Inventors: Nobuyoshi Kobayashi, Hachioji; Nobuo Hara, Kokubunji; Seiichi Iwata, Sayama; Naoki Yamamoto, Kawaguchi, all of Japan

[73] Assignee: Hitachi, Ltd., Tokyo, Japan

[21] Appl. No.: 48,968

[22] Filed: May 13, 1987

Related U.S. Application Data

[63] Continuation of Ser. No. 810,188, Dec. 18, 1985, abandoned.

[30] Foreign Application Priority Data

Dec. 24, 1984 [JP] Japan .................................. 59-270884

[51] Int. Cl.⁴ ...................... H01L 23/48; H01L 29/78
[52] U.S. Cl. ........................................ 357/67; 357/23.1
[58] Field of Search ............................ 357/67, 23.1, 15

[56] References Cited

U.S. PATENT DOCUMENTS

| 4,270,236 | 5/1981 | Toyokura et al. ..................... 357/67 |
| 4,344,222 | 8/1982 | Bergeron et al. ..................... 351/54 |
| 4,394,673 | 7/1983 | Thompson et al. .................. 357/678 |
| 4,557,036 | 12/1985 | Kyuragi et al. ........................ 357/67 |
| 4,700,215 | 10/1987 | McPherson ............................ 357/71 |

FOREIGN PATENT DOCUMENTS

| 58-199523 | 11/1983 | Japan ..................................... 357/67 |
| 59-167058 | 9/1984 | Japan ..................................... 357/67 |

OTHER PUBLICATIONS

Yamoto et al, Semiconductor Device Transistor Meeting on Japanese Electrocommunication Society, SSBD 89-98, pp. 39-45.

C. Hu et al, "A Resistive-gated IGFET Tetrode," *IEEE Transactions on Electron Devices*, vol. ED-18 (1971) pp. 418-425.

*Primary Examiner*—J. Carroll
*Attorney, Agent, or Firm*—Antonelli, Terry & Wands

[57] ABSTRACT

A semiconductor device which is provided with an electrode and/or an interconnection made of a refractory metal film containing silicon oxide is disclosed. A refractory metal film containing silicon oxide has high capability of blocking penetration of ions and is suitable for being employed as a mask for forming a source and a drain of an MOS transistor by ion-implantation and as it has strong adhesion with an insulation film improves reliability of a semiconductor device.

24 Claims, 1 Drawing Sheet

SEMICONDUCTOR DEVICE HAVING ELECTRODES AND OR INTERCONNECTIONS OF REFRACTORY METAL FILM CONTAINING SILICON OXIDE

This application is a continuation of application Ser. No. 810,188, filed Dec. 18, 1985, abandoned.

BACKGROUND OF THE INVENTION

This invention relates to a semiconductor device, and more particularly a semiconductor device wherein a conductive film mainly composed of refractory metal such as W, Mo, Ti or Ta is employed as an electrode and/or an interconnection.

As already known, in MOS transistors of the prior art, a polycrystalline silicon film is most widely employed as a gate electrode and an interconnection which is formed solidly with the gate electrode and extends to the other region such as a drain of another MOS transistor.

However, along with remarkable improvement of an integration of a semiconductor device, it is proposed to employ a film of refractory metal such as W, Mo, Ti or Ta as a gate electrode and an interconnection.

Because such refractory metal has not only a high melting point but also much lower electrical resistance than polycrystalline silicon, it is not only resistant against high temperature thermal treatment but also very much suited for electrodes and interconnections between transistors with extremely fine dimensions.

However, there is a problem that when a source and a drain of an MOS transistor are formed by ionimplantation utilizing a gate electrode of such refractory metal film as a mask, ions penetrate through the gate electrode and are trapped in a channel region between a source and a drain.

There is also a problem that because of poor adhesiveness of the refractory metal film with an insulator film such as an $SiO_2$ film, the electrode and the interconnection of refractory metal are easily peeled off from the insulator film substrate so that reliability of the semiconductor device is adversely affected.

Especially when a refractory metal film is formed on an $SiO_2$ film by CVD (chemical vapor deposition), adhesion between the metal film and the $SiO_2$ film is very weak so that improvement is obviously required.

SUMMARY OF THE INVENTION

It is an object of the present invention to provide a semiconductor device which has an electrode and/or an interconnection which solve the problems mentioned above, have high capability of blocking, penetration of ions, have strong adhesion with an insulator film and have extremely high reliability.

In order to realize the object, in this invention, penetration of ions at the time of ion-implantation is blocked and adhesiveness between an electrode and/or an interconnection of an MOS transistor or the like and an insulation film is improved by employing a film of refractory metal containing 1 ppm~40 wt % of $SiO_2$ as the electrode and/or the interconnection.

DETAILED DESCRIPTION OF THE PREFERRED EMBODIMENTS

When a refractory metal film is formed on an insulator film by a known method such as CVD or sputtering, the obtained refractory metal film has columnar crystal structure.

When source and drain regions of an MOS transistor are formed by ion-implantation utilizing a gate electrode formed with the film of such columnar structure, ions are penetrated through the gate electrode and are implanted in a channel region of the MOS transistor where ions are primarily not supposed to be implanted as previously mentioned and it becomes difficult to form the MOS transistor.

This phenomenon is called channeling. However, it was recognized that when $SiO_2$ was added in the refractory metal film, the growth of the columnar crystal was suppressed and at the same time, as $Sio_2$ itself had high capability of blocking the penetration of ions, channeling was efficiently avoided.

It was also recognized that adhesion between the refractory metal film, and an insulation film was substantially improved by adding $SiO_2$ in the refractory metal film.

Therefore, if a refractory metal film containing $SiO_2$ is employed as a gate electrode of an MOS transistor, source and drain regions are effectively formed by ion-implantation while efficiently avoiding generation of channeling and at the same time adhesion between the gate electrode and the insulation film is improved so that reliability of the semiconductor device is significantly improved.

Embodiment 1

Figure 1A:
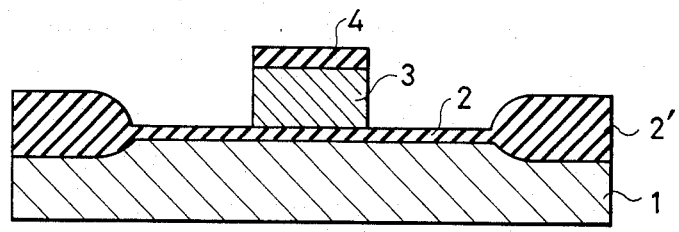
FIG. 1a~FIG. 1c show a manufacturing process of one embodiment of a semiconductor device of the present invention and FIG. 2 is a sectional view showing another embodiment of the present invention.

As shown in FIG. 1a, after a thick $SiO_2$ film 2' for isolation and a gate $SiO_2$ film 2 of 20 nm thickness were formed on a P-type Si substrate 1 by known thermal oxidation method, a W (tungsten) film 3 of 300 nm thickness containing 0.5 wt % of Si was formed by CVD.

Forming conditions of the W film formed by CVD were:
silicon substrate temperature: 350° C.;
gas flow of $WF_6$: 20 cc/min.;
gas flow of $SiH_4$: 4 cc/min.;
gas flow of $H_2$: 2 2 l/min.;
total pressure in a reaction chamber: 0.7 Torr; and deposition time: 20 minutes.

Si contained in the W film was oxidized to be converted into $SiO_2$ by thermal treatment in $H_2$ containing 5 % of $H_2O$ at 900° C. for 20 minutes.

As a result, approximately 1 wt % of $SiO_2$ was contained in the W film.

By thermal treatment in gas mixture of $H_2$ and $H_2O$, only Si is selectively oxidized while W is not oxidized. Therefore, only Si in the W film 3 was converted into $SiO_2$ and W was not oxidized.

By converting Si in the W film 3 into $SiO_2$ by thermal treatment, adhesiveness between the W film 3 and the $SiO_2$ film 2 was significantly improved.

Adhesion of a W film which is formed by CVD employing $WF_6$ and $H_2$ as source gases and does not contain $SiO_2$ is poor and the W film is apt to peel off in a subsequent process. However, the W film containing 1 wt % of SiO$_2$ and formed in this embodiment did not show such peeling off from the substrate.

Then, after a phosphosilicate glass film 4 of about 50 nm thickness was formed on the W film 3 by CVD, unnecessary parts of the phosphosilicate glass film 4 and the W film 3 were removed by reactive sputter etching.

Figure 1B:
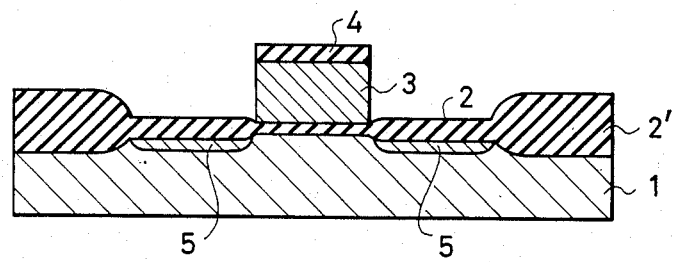

Arsenic ions were implanted under the conditions that acceleration energy was 80 keV and dosage density was $5 \times 10^{15}$ cm$^{-2}$ to form N±type source and drain regions 5 as shown in FIG. 1b utilizing the gate electrode 3 of the W film and the phosphosilicate glass film 4 formed on the electrode 3 as described above as a mask.

The phosphosilicate glass film 4 was employed to reinforce blocking capability of the gate electrode 3 against As ions and channeling was perfectly avoided in this embodiment.

Figure 1C:
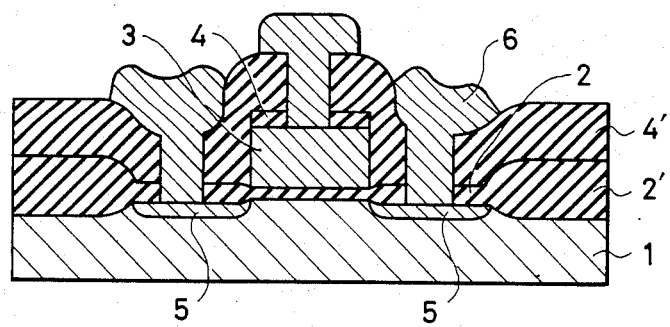

As shown in FIG. 1c, after a second phosphosilicate glass film 4' was formed on the whole surface, respective contact holes were opened on the source and drain regions 5 and the gate electrode 3 by a known photoetching technique to form an Al interconnection 6.

An MOS transistor formed as described above showed excellent electrical characteristics and it was confirmed that a W film containing SiO$_2$ could be employed as an extremely satisfactory gate electrode of an MOS transistor.

In the present invention, it is desirable that content of SiO$_2$ contained in the refractory metal film is kept within a predetermined range.

In other words, if the SiO$_2$ content of the film of refractory metal such as W or Mo is less than 1 ppm, adhesiveness with the insulation film is hardly improved. Therefore, it is preferable that the content of SiO$_2$ is not less than 1 ppm.

With increase of the content of SiO$_2$ contained in the refractory metal film, adhesiveness with the insulation film is gradually improved, but at the same time electrical resistance of the refractory metal film also gradually increases.

If the content of SiO$_2$ exceeds approximately 40 wt %, the electrical resistance becomes so large that the refractory metal film can hardly be employed as an electrode and an interconnection of a semiconductor device with high integration.

Therefore, the content of SiO$_2$ contained in the refractory metal film should not be more than 40 wt %.

In this embodiment, the same results were obtained when an Mo film was employed in place of the W film.

Embodiment 2

An SiO$_2$ film was formed on a P-type Si substrate by a known thermal oxidization method.

Then a W film containing approximately 3 wt % of Si was formed. (Content of SiO$_2$ obtained by oxidizing the Si was about 6 %.)

Adhesion strengths between the W film and the SiO$_2$ film were measured and compared after being subjected to thermal treatment in an atmosphere of H$_2$ containing approximately 3 percent of H$_2$O at the temperature 500°, 600°, 700°, 800°, 900° and 1000° C. for 30 minutes.

The adhesion strength was determined by adhering a grip to the surface of the W film, pulling the grip upward and measuring the force necessary to peel the W film 7 off the SiO$_2$ film 2.

The obtained results are shown in Table 1.

TABLE 1

| Heating Temp. | No heating | 500° C. | 600° C. | 700° C. | 800° C. | 900° C. | 1000° C. |
|---|---|---|---|---|---|---|---|
| Adhesiveness | x | x | x | o | o | o | o |

(o) ... good
(x) ... poor

In Table 1, a mark (o) shows the case where the W film 7 was not peeled off when the grip was pulled upward by a force of 7 kg/cm$^2$ and a mark (x) shows the case where the W film 7 was peeled off when the grip was pulled upward by a force less than 7 kg/cm$^2$.

It is clear from Table 1 that if the heating temperature is 700° C. and above, the adhesion between the W film 7 and the insulation film 2 is significantly improved.

Analysis of the surface of the W film after peeling off by ESCA (Electron Spectroscopy of Chemical Analysis) showed that Si in the boundary between W and SiO$_2$ was not sufficiently oxidized when the W film was not heated or heated at 500° C. and 600° C.

Si in the W film subjected to thermal treatment at the temperature 700° C. and above was analysed by etching the surface of the W film with a solution of hydrogen peroxide in water. In this case, it was recognized that Si in the W film was completely oxidized and a sufficient amount of SiO$_2$ existed in the boundary and its vicinity.

From those results, it was confirmed that, when SiO$_2$ existed in the refractory metal film, adhesion between the metal film and the insulation film was improved and especially SiO$_2$ existing in the boundary between the metal film and the insulation film and in its vicinity significantly improved adhesiveness.

Moreover, the measured sheet resistance of the W film subjected to thermal treatment at 1000° C. for 30 minutes was approximately 0.5 Ω/□ and it was higher than that of a W film containing no SiO$_2$ by less than only 10 %. Therefore, this W film can be employed as an electrode and an interconnection of a semiconductor device without any problems.

Embodiment 3

In the previous two embodiments, the W film containing SiO$_2$ was formed by oxidizing Si in the W film after the W film containing Si was formed on the insulation film.

In this embodiment, a W film containing SiO$_2$ was formed on an insulation film by CVD without thermal treatment described above.

Conditions of CVD for formation of the W film were:
substrate temperature: 350° C.;
gas flow of WF$_6$: 20 cc/min.;
gas flow of SiH$_4$: 4 cc/min.;
gas flow of H$_2$: 2 l/min.;
gas flow of O$_2$: 0.1 cc/min.; and
deposition time: 10 minutes.

These conditions of types of gases and their flows were the same as those in the embodiment 1 except that O$_2$ was added and also the substrate temperature was the same as that of the embodiment 1.

The W film formed by the CVD described above had a film thickness of about 100 nm and contained approximately 3 wt % of SiO$_2$ and had excellent adhesion with the SiO$_2$ film foundation.

Therefore, in order to form a refractory metal film containing SiO$_2$, a refractory metal film containing Si may be formed and Si in the film may be oxidized as described in the embodiments 1 and 2 or a refractory metal film containing SiO$_2$ may be formed directly by CVD as described in this embodiment.

Embodiment 4

Figure 2:
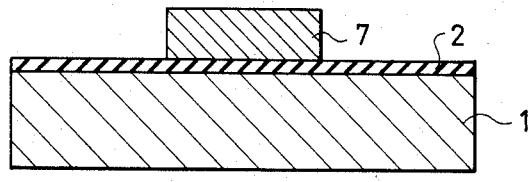

As shown in FIG. 2, an Mo film 7 of 350 nm thickness containing approximately 10 wt % of SiO$_2$ was formed by co-sputtering after an SiO$_2$ film 2 of 20 nm thickness was formed on an Si substrate.

An electrode was formed by removing unnecessary parts of the Mo film 7 by a known photolithography technique to form an MOS diode.

After As ions were implanted into the substrate 1 under conditions in which accelerating voltage was 60 keV and dosage was $5 \times 10^{15}$ cm$^{-2}$ utilizing the electrode 7 of the Mo film as a mask, C - V (capacitance—voltage applied to the gate) characteristics were measured and the obtained C - V characteristic curve was normal.

However, when an Mo film containing no SiO$_2$ was employed, implanted As ions were penetrated through the Mo film and were doped beneath the Mo film so that the normal C - V characteristic curve was not obtained. Thus the effect of SiO$_2$ contained in the Mo film was confirmed. When a W film was employed in place of the Mo film, the same results were obtained.

It is clear from the above description that, with the present invention, ion channeling at the time of ion-implantation, which was a problem when refractory metal was employed as an electrode and/or an interconnection of a semiconductor device, is prevented. Also, poor adhesion between refractory metal and an insulation film, which was also a problem in the prior art, is significantly improved and the refractory metal film can be formed directly on an insulation film such as an SiO$_2$ film formed by CVD. It is to be noted that, although W and Mo were employed as refractory metals in the embodiments described above, it was recognized that other refractory metals such as Ti and Ta had the same effects. Silicon oxide contained in refractory metal need not necessarily be SiO$_2$ only; any type of silicon oxide (SiO$_x$) has the same effect.

It is effective as described above and can be applied easily to manufacturing of a semiconductor device and is an excellent method from the viewpoints of economy and efficiency for SiO$_2$ to be contained in refractory metal according to the present invention.

What is claimed is:

1. A semiconductor device comprising:
   an insulator film formed on a substrate; and
   an electrode and/or an interconnection made of refractory metal film, of a refractory metal selected from the group consisting of W, Mo, Ti and Ta, having a desired shape formed on said insulator film,
   wherein said refractory metal film contains silicon oxide, the content of the silicon oxide being not less than 1 ppm and not more than 40 weight percent, so as to provide increased adhesion between the refractory metal film and the insulator film as compared to the adhesion between the refractory metal film and the insulator film without silicon oxide being contained in the refractory metal film.

2. A semiconductor device as claimed in claim 1, wherein said insulator film is a silicon dioxide film.

3. A semiconductor device as claimed in claim 1, wherein said refractory metal film is a gate electrode of an MOS transistor.

4. A semiconductor device as claimed in claim 3, wherein said refractory metal film is a W film or an Mo film.

5. A semiconductor device as claimed in claim 3, wherein a phosphosilicate glass film of the same shape as said gate electrode is formed on said gate electrode.

6. A semiconductor device as claimed in claim 3, wherein said MOS transistor is provided with an interconnection formed solidly with said gate electrode.

7. A semiconductor device as claimed in claim 1, wherein said refractory metal film is an electrode of an MOS diode.

8. A semiconductor device as claimed in claim 1, wherein the refractory metal is selected from the group consisting of W and Mo.

9. A semiconductor device as claimed in claim 1, wherein said substrate is a semiconductor substrate.

10. A semiconductor device as claimed in claim 9, wherein said insulator film is a silicon oxide film, and said substrate is a silicon substrate.

11. A semiconductor device comprising:
    an insulator film formed on a substrate; and
    an electrode and/or an interconnection made of refractory metal film having a desired shape formed on said insulator film, the refractory metal film containing a refractory metal selected from the group consisting of W, Mo, Ti and Ta,
    wherein said refractory metal film contains silicon oxide so as to increase adhesion between the refractory metal film and the insulator film as compared to the adhesion between the refractory metal film and the insulator film without silicon oxide being contained in the refractory metal film, the content of the silicon oxide being not less than 1 ppm and not more than 40 weight percent, so as to provide the increased adhesion.

12. A semiconductor device as claimed in claim 1, wherein said refractory metal film contains silicon oxide distributed throughout said film.

13. A semiconductor device as claimed in claim 11, wherein said refractory metal film contains silicon oxide distributed throughout said film.

14. A semiconductor device as claimed in claim 1, wherein said refractory metal film contains silicon oxide at least at the boundary between the insulator film and the refractory metal film.

15. A semiconductor device as claimed in claim 14, wherein said refractory metal film Contains silicon oxide at the boundary between the insulator film and the refractory metal film and in the vicinity thereof.

16. A semiconductor device as claimed in claim 11, wherein said refractory metal film contains silicon oxide at least at the boundary between the insulator film and the refractory metal film.

17. A semiconductor device as claimed in claim 1, wherein the refractory metal film containing silicon oxide is a film formed by co-depositing a refractory metal and silicon, so as to form a refractory metal film containing silicon throughout the film, and oxidizing the silicon throughout the film, without oxidizing the refractory metal, so as to form a refractory metal film containing silicon oxide throughout the film.

18. A semiconductor device as claimed in claim 1, wherein the refractory metal film containing silicon oxide is a film formed by co-depositing the refractory metal and silicon oxide so as to provide a refractory metal film containing silicon oxide throughout the film.

19. A semiconductor device as claimed in claim 1, wherein said refractory metal film is formed in contact with said insulator film.

20. A semiconductor device as claimed in claim 19, wherein the insulator film is comprised of silicon oxide.

21. A semiconductor device as claimed in claim 11, wherein said refractory metal film is formed in contact with said insulator film.

22. A semiconductor device as claimed in claim 21, wherein the insulator film is comprised of silicon oxide.

23. A semiconductor device as claimed in claim 1, wherein said semiconductor device includes ion-implanted regions, the ion-implanted regions having been formed using said electrode and/or interconnection made of refractory metal film containing silicon oxide as a mask, whereby the refractory metal film containing silicon oxide suppresses penetration of ions through the refractory metal film as compared to penetration of ions through a refractory metal film without silicon oxide being contained in the refractory metal film.

24. A semiconductor device as claimed in claim 11, wherein said semiconductor device includes ion-implanted regions, the ion-implanted regions having been formed using said electrode and/or interconnection made of refractory metal film containing silicon oxide as a mask, whereby the refractory metal film containing silicon oxide suppresses penetration of ions through the refractory metal film as compared to penetration of ions through a refractory metal film without silicon oxide being contained in the refractory metal film.

* * * * *